(12) United States Patent
Langhammer et al.

(10) Patent No.: US 8,805,916 B2
(45) Date of Patent: Aug. 12, 2014

(54) DIGITAL SIGNAL PROCESSING CIRCUITRY WITH REDUNDANCY AND BIDIRECTIONAL DATA PATHS

(75) Inventors: Martin Langhammer, Alderbury (GB); Yi-Wen Lin, Glendale, CA (US); Keone Streicher, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 958 days.

(21) Appl. No.: 12/380,841

(22) Filed: Mar. 3, 2009

(65) Prior Publication Data

US 2010/0228807 A1 Sep. 9, 2010

(51) Int. Cl.
| | | |
|---|---|---|
| G06F 7/38 | (2006.01) | |
| G06F 7/00 | (2006.01) | |
| G06F 15/00 | (2006.01) | |
| H03K 19/173 | (2006.01) | |
| H03K 19/177 | (2006.01) | |
| H01L 25/00 | (2006.01) | |
| H03K 5/1252 | (2006.01) | |
| G06F 7/53 | (2006.01) | |

(52) U.S. Cl.
CPC ........ H03K 5/1252 (2013.01); *G06F 2207/382* (2013.01); *H03K 19/17732* (2013.01); *G06F 7/5324* (2013.01)
USPC ............... 708/523; 708/603; 326/38; 326/41; 326/47

(58) Field of Classification Search
USPC ...................... 326/37–47; 708/490, 523, 603, 708/620–625
See application file for complete search history.

(56) References Cited

U.S. PATENT DOCUMENTS

| | | |
|---|---|---|
| 3,473,160 A | 10/1969 | Wahlstrom |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,597,053 A | 6/1986 | Chamberlin |
| 4,623,961 A | 11/1986 | Mackiewicz |
| 4,682,302 A | 7/1987 | Williams |
| 4,718,057 A | 1/1988 | Venkitakrishnan et al. |

(Continued)

FOREIGN PATENT DOCUMENTS

| | | |
|---|---|---|
| EP | 0 158 430 | 10/1985 |
| EP | 0 380 456 | 8/1990 |

(Continued)

OTHER PUBLICATIONS

Amos, D., "PLD architectures match DSP algorithms" *Electronic Product Design*, vol. 17, No. 7, Jul. 1996, pp. 30, 32.

(Continued)

*Primary Examiner* — Chuong D Ngo
*Assistant Examiner* — Matthew Sandifer
(74) *Attorney, Agent, or Firm* — Ropes & Gray LLP; Jeffrey H. Ingerman

(57) ABSTRACT

Digital signal processing ("DSP") circuit blocks are provided that can more easily work together to perform larger (e.g., more complex and/or more arithmetically precise) DSP operations if desired. These DSP blocks may also include redundancy circuitry that facilitates stitching together multiple such blocks despite an inability to use some block (e.g., because of a circuit defect).

31 Claims, 9 Drawing Sheets

(56) References Cited

U.S. PATENT DOCUMENTS

| | | | |
|---|---|---|---|
| 4,727,508 A | 2/1988 | Williams | |
| 4,736,333 A | 4/1988 | Mead et al. | |
| 4,791,590 A | 12/1988 | Ku et al. | |
| 4,799,004 A | 1/1989 | Mori | |
| 4,823,295 A | 4/1989 | Mader | |
| 4,839,847 A | 6/1989 | Laprade | |
| 4,871,930 A | 10/1989 | Wong et al. | |
| 4,912,345 A | 3/1990 | Steele et al. | |
| 4,967,160 A | 10/1990 | Quievy et al. | |
| 4,972,356 A | 11/1990 | Williams | |
| 4,982,354 A | 1/1991 | Takeuchi et al. | |
| 4,994,997 A | 2/1991 | Martin et al. | |
| 5,122,685 A | 6/1992 | Chan et al. | |
| 5,128,559 A | 7/1992 | Steele | |
| 5,175,702 A | 12/1992 | Beraud et al. | |
| 5,208,491 A | 5/1993 | Ebeling et al. | |
| RE34,363 E | 8/1993 | Freeman | |
| 5,258,668 A * | 11/1993 | Cliff et al. | 326/41 |
| 5,267,187 A | 11/1993 | Hsieh et al. | |
| 5,296,759 A | 3/1994 | Sutherland et al. | |
| 5,338,983 A | 8/1994 | Agarwala | |
| 5,349,250 A | 9/1994 | New | |
| 5,357,152 A | 10/1994 | Jennings, III et al. | |
| 5,371,422 A | 12/1994 | Patel et al. | |
| 5,381,357 A | 1/1995 | Wedgwood et al. | |
| 5,404,324 A | 4/1995 | Colon-Bonet | |
| 5,424,589 A | 6/1995 | Dobbelaere et al. | |
| 5,442,576 A * | 8/1995 | Gergen et al. | 708/209 |
| 5,442,799 A * | 8/1995 | Murakami et al. | 712/36 |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,828 A | 3/1996 | Doddington et al. | |
| 5,517,436 A * | 5/1996 | Andreas et al. | 708/524 |
| 5,523,963 A | 6/1996 | Hsieh et al. | |
| 5,528,550 A | 6/1996 | Pawate et al. | |
| 5,537,601 A | 7/1996 | Kimura et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,522 A | 7/1997 | Moyse et al. | |
| 5,646,545 A | 7/1997 | Trimberger et al. | |
| 5,648,732 A | 7/1997 | Duncan | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | |
| 5,696,708 A | 12/1997 | Leung | |
| 5,729,495 A | 3/1998 | Madurawe | |
| 5,740,404 A | 4/1998 | Baji | |
| 5,744,980 A | 4/1998 | McGowan et al. | |
| 5,744,991 A | 4/1998 | Jefferson et al. | |
| 5,751,622 A | 5/1998 | Purcell | |
| 5,754,459 A | 5/1998 | Telikepalli | |
| 5,761,483 A | 6/1998 | Trimberger | |
| 5,764,555 A | 6/1998 | McPherson et al. | |
| 5,765,013 A * | 6/1998 | Jang et al. | 712/17 |
| 5,768,613 A | 6/1998 | Asghar | |
| 5,777,912 A | 7/1998 | Leung et al. | |
| 5,784,636 A | 7/1998 | Rupp | |
| 5,790,446 A | 8/1998 | Yu et al. | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,812,479 A | 9/1998 | Cliff et al. | |
| 5,812,562 A | 9/1998 | Baeg | |
| 5,815,422 A | 9/1998 | Dockser | |
| 5,821,776 A | 10/1998 | McGowan | |
| 5,825,202 A | 10/1998 | Tavana et al. | |
| 5,838,165 A | 11/1998 | Chatter | |
| 5,841,684 A | 11/1998 | Dockser | |
| 5,847,579 A | 12/1998 | Trimberger | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | |
| 5,878,250 A | 3/1999 | LeBlanc | |
| 5,880,981 A | 3/1999 | Kojima et al. | |
| 5,883,525 A * | 3/1999 | Tavana et al. | 326/39 |
| 5,892,962 A | 4/1999 | Cloutier | |
| 5,894,228 A | 4/1999 | Reddy et al. | |
| 5,898,602 A | 4/1999 | Rothman et al. | |
| 5,914,616 A * | 6/1999 | Young et al. | 326/41 |
| 5,931,898 A | 8/1999 | Khoury | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,968,196 A | 10/1999 | Ramamurthy et al. | |
| 5,970,254 A | 10/1999 | Cooke et al. | |
| 5,978,260 A | 11/1999 | Trimberger et al. | |
| 5,982,195 A | 11/1999 | Cliff et al. | |
| 5,986,465 A | 11/1999 | Mendel | |
| 5,991,788 A | 11/1999 | Mintzer | |
| 5,991,898 A | 11/1999 | Rajski et al. | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,006,321 A | 12/1999 | Abbott | |
| 6,009,451 A | 12/1999 | Burns | |
| 6,020,759 A | 2/2000 | Heile | |
| 6,021,423 A | 2/2000 | Nag et al. | |
| 6,029,187 A | 2/2000 | Verbauwhede | |
| 6,031,763 A | 2/2000 | Sansbury | |
| 6,041,340 A | 3/2000 | Mintzer | |
| 6,052,327 A | 4/2000 | Reddy et al. | |
| 6,052,755 A | 4/2000 | Terrill et al. | |
| 6,064,614 A | 5/2000 | Khoury | |
| 6,065,131 A | 5/2000 | Andrews et al. | |
| 6,066,960 A | 5/2000 | Pedersen | |
| 6,069,487 A | 5/2000 | Lane et al. | |
| 6,072,994 A | 6/2000 | Phillips et al. | |
| 6,073,154 A | 6/2000 | Dick | |
| 6,075,381 A | 6/2000 | LaBerge | |
| 6,084,429 A | 7/2000 | Trimberger | |
| 6,085,317 A | 7/2000 | Smith | |
| 6,091,261 A | 7/2000 | DeLange | |
| 6,091,765 A | 7/2000 | Pietzold, III et al. | |
| 6,094,726 A | 7/2000 | Gonion et al. | |
| 6,097,988 A | 8/2000 | Tobias | |
| 6,098,163 A | 8/2000 | Guttag et al. | |
| 6,107,820 A | 8/2000 | Jefferson et al. | |
| 6,107,821 A | 8/2000 | Kelem et al. | |
| 6,107,824 A | 8/2000 | Reddy et al. | |

(56) References Cited

U.S. PATENT DOCUMENTS

| | | |
|---|---|---|
| 6,130,554 A | 10/2000 | Kolze et al. |
| 6,140,839 A | 10/2000 | Kaviani et al. |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,278,291 B1 * | 8/2001 | McClintock et al. ............ 326/41 |
| 6,279,021 B1 | 8/2001 | Takano et al. |
| 6,286,024 B1 | 9/2001 | Yano et al. |
| 6,298,366 B1 * | 10/2001 | Gatherer et al. ............. 708/523 |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,344,755 B1 * | 2/2002 | Reddy et al. ..................... 326/10 |
| 6,351,142 B1 | 2/2002 | Abbott |
| 6,359,468 B1 | 3/2002 | Park et al. |
| 6,362,650 B1 | 3/2002 | New et al. |
| 6,366,944 B1 | 4/2002 | Hossain et al. |
| 6,367,003 B1 | 4/2002 | Davis |
| 6,407,576 B1 | 6/2002 | Ngai et al. |
| 6,407,694 B1 | 6/2002 | Cox et al. |
| 6,438,570 B1 | 8/2002 | Miller |
| 6,448,808 B2 * | 9/2002 | Young et al. .................... 326/41 |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,557,096 B1 | 4/2003 | Ganapathy et al. |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,788 B1 | 7/2003 | Dick et al. |
| 6,628,140 B2 | 9/2003 | Langhammer et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,744,278 B1 | 6/2004 | Liu et al. |
| 6,745,254 B2 | 6/2004 | Boggs et al. |
| 6,774,669 B1 | 8/2004 | Liu et al. |
| 6,781,408 B1 * | 8/2004 | Langhammer .................. 326/41 |
| 6,781,410 B2 | 8/2004 | Pani et al. |
| 6,788,104 B2 | 9/2004 | Singh et al. |
| 6,836,839 B2 | 12/2004 | Master et al. |
| 6,874,079 B2 * | 3/2005 | Hogenauer ................... 712/201 |
| 6,904,471 B2 | 6/2005 | Boggs et al. |
| 6,924,663 B2 | 8/2005 | Masui et al. |
| 6,971,083 B1 | 11/2005 | Farrugia et al. |
| 7,047,271 B2 | 5/2006 | Aldrich et al. |
| 7,061,268 B1 | 6/2006 | Lee et al. |
| 7,119,576 B1 | 10/2006 | Langhammer et al. |
| 7,180,324 B2 * | 2/2007 | Chan et al. ....................... 326/10 |
| 7,230,451 B1 * | 6/2007 | Langhammer .................. 326/41 |
| 7,269,617 B1 * | 9/2007 | Esposito et al. ............. 708/625 |
| 7,287,051 B1 * | 10/2007 | Langhammer ................ 708/490 |
| 7,346,644 B1 * | 3/2008 | Langhammer et al. ....... 708/625 |
| 7,368,942 B1 * | 5/2008 | Hutton et al. ................... 326/41 |
| 7,471,643 B2 * | 12/2008 | Stansfield ..................... 370/254 |
| 7,698,358 B1 * | 4/2010 | Langhammer et al. ....... 708/523 |
| 7,746,112 B1 * | 6/2010 | Gaide et al. ..................... 326/41 |
| 7,836,117 B1 * | 11/2010 | Langhammer et al. ....... 708/603 |
| 8,458,243 B1 * | 6/2013 | Demirsoy et al. ............ 708/522 |
| 2001/0029515 A1 | 10/2001 | Mirsky |
| 2002/0089348 A1 | 7/2002 | Langhammer |
| 2003/0041082 A1 | 2/2003 | Dibrino |
| 2003/0072185 A1 * | 4/2003 | Lane et al. ................ 365/189.02 |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0178818 A1 | 9/2004 | Crotty et al. |
| 2004/0193981 A1 | 9/2004 | Clark et al. |
| 2005/0144215 A1 * | 6/2005 | Simkins et al. ............... 708/620 |
| 2005/0166038 A1 | 7/2005 | Wang et al. |
| 2005/0187999 A1 | 8/2005 | Zheng et al. |
| 2006/0075012 A1 * | 4/2006 | Minz et al. .................... 708/490 |
| 2007/0143577 A1 * | 6/2007 | Smith ............................ 712/10 |
| 2007/0185651 A1 | 8/2007 | Motoyama et al. |
| 2007/0185951 A1 * | 8/2007 | Lee et al. ...................... 708/493 |
| 2007/0185952 A1 | 8/2007 | Langhammer et al. |
| 2008/0133627 A1 | 6/2008 | Langhammer et al. |
| 2009/0228538 A1 | 9/2009 | Nagano et al. |
| 2009/0259824 A1 * | 10/2009 | Smith et al. ..................... 712/10 |
| 2010/0097099 A1 * | 4/2010 | Minz et al. ..................... 326/41 |
| 2010/0306292 A1 | 12/2010 | Catherwood et al. |
| 2012/0290819 A1 * | 11/2012 | Langhammer ................ 712/222 |
| 2013/0135008 A1 * | 5/2013 | Zhang et al. .................... 326/41 |

FOREIGN PATENT DOCUMENTS

| | | |
|---|---|---|
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| EP | 1 603 241 | 12/2005 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| JP | 11-296345 | 10/1999 |
| JP | 2000-347834 | 12/2000 |
| WO | WO 92/00561 | 1/1992 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO2005/066832 | 7/2005 |
| WO | WO2005/101190 | 10/2005 |
| WO | WO 2006/076276 | 7/2006 |

OTHER PUBLICATIONS

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science vol. 1896)* Aug. 27-30, 2000, pp. 456-461.

(56) References Cited

OTHER PUBLICATIONS

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings—Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.

Gaffar, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx" *Parallel and distributed processing: 15 IPDPS 2000 workshops*, Rolim, J., ed., May 1-5, 2000, p. 873.

Hauck, S., "The Future of Reconfigurable Systems" *Keynote Address, 5th Canadian Conference on Field Programmable Devices*, Jun. 1998, http://www.ee.washington.edu/people/faculty/hauck/publications/RecongfigFuture.PDF.

Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science vol. 1896)*, Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGS Express™ Interface Manual: ispLEVER® Version 3.0*, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA" *1996 2nd International Conference on ASIC Proceedings* (IEEE Cat. No. 96TH8140) Oct. 21-24, 1996, pp. 275-279.

Jones, G., "Field-programmable digital signal conditioning" *Electronic Product Design*, vol. 21, No. 6, Jun. 2000, pp. C36-C38.

Kiefer, R., et al., "Performance comparison of software/FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.

Kramberger, I., "DSP acceleration using a reconfigurable FPGA," *ISIE '99. Proceedings of the IEEE International Symposium on Industrial Electronics* (Cat. No. 99TH8465) vol. 3, Jul. 12-16, 1999, pp. 1522-1525.

Langhammer, M., "How to implement DSP in programmable logic," *Elettronica Oggi*, No. 266, Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems (Digest)* No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9) vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)* vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303) Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science vol. 1673)*, Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

(56) References Cited

OTHER PUBLICATIONS

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.
Weisstein, E.W., "Karatsuba Multiplication" *MathWorld—A Wolfram Web Resource* (Dec. 9, 2007), accessed Dec. 11, 2007 at http://mathworld.wolfram.com/KaratsubaMultiplication.html.
Wenzel, L., "Field programmable gate arrays (FPGAs) to replace digital signal processor integrated circuits," *Elektronik*, vol. 49, No. 5, Mar. 7, 2000, pp. 78-86.
"Xilinx Unveils New FPGA Architecture to Enable High-Performance, 10 Million System Gate Designs", *Xilinx*, Jun. 22, 2000.
"Xilinx Announces DSP Algorithms, Tools and Features for Virtex-II Architecture", *Xilinx*, Nov. 21, 2000.
Xilinx Inc., "Virtex-II 1.5V Field-Programmable Gate Arrays", Advance Product Specification, DS031-2 (v1.9), Nov. 29, 2001, Module 2 of 4, pp. 1-39.
Xilinx Inc., "Using Embedded Multipliers", Virtex-II Platform FPGA Handbook, UG002 (v1.3), Dec. 3, 2001, pp. 251-257.
Xilinx, Inc., "A 1D Systolic FIR," copyright 1994-2002, downloaded from http://www.iro.umontreal.ca/~aboulham/F6221/Xilinx%20A%201D%20systolic%20FIR.htm.
Xilinx, Inc., "The Future of FPGA's," White Paper, available Nov. 14, 2005 for download from http://www.xilinx.com/prs_rls,5yrwhite.htm.
"Virtex-5 XtremeDSP Design Considerations," User Guide, UG193 (v1.3), pp. 71-72, Xilinx Corporation, Jul. 28, 2006.
Stratix III Device Handbook, vol. 1, pp. 5-22 through 5-23, Altera Corporation, San Jose, CA, Nov. 2006.
"XtremeDSP for Virtex-4 FPGAs," User Guide, UG073 (v2.4), pp. 35-36, Xilinx Corporation, Jan. 8, 2007.
"XtremeDSP for Spartan-3A DSP," User Guide, UG431 (v1.0), pp. 29-30, Xilinx Corporation, Apr. 2, 2007.
"DSP Blocks in Stratix & Stratix GX Devices," Stratix Device Handbook, vol. 2, pp. 6-1 through 6-28, Altera Corporation, San Jose, CA, Jul. 2005.
"DSP Blocks in Stratix II and Stratix II GX Devices," Stratix II Device Handbook, vol. 2, pp. 6-1 through 6-34, Altera Corporation, San Jose, CA, Jan. 2008.
"DSP Blocks in Stratix III Devices," Stratix III Device Handbook, vol. 1, pp. 5-1 through 5-50, Altera Corporation, San Jose, CA, Oct. 2007.
"DSP Blocks in Stratix III Devices," Stratix III Device Handbook, vol. 1, pp. 5-1 through 5-40, Altera Corporation, San Jose, CA, May 2009.
"DSP Blocks in Stratix IV Devices," Stratix IV Device Handbook, vol. 1, pp. 4-1 through 4-44, Altera Corporation, San Jose, CA, May 2008.
"DSP Blocks in Stratix IV Devices," Stratix IV Device Handbook, vol. 1, pp. 4-1 through 4-34, Altera Corporation, San Jose, CA, Nov. 2008.
"DSP Blocks in Stratix IV Devices," Stratix IV Device Handbook, vol. 1, pp. 4-1 through 4-36, Altera Corporation, San Jose, CA, Nov. 2009.
"Embedded Multipliers in Cyclone III Devices," Cyclone III Device Handbook, vol. 1, pp. 5-1 through 5-8, Altera Corporation, San Jose, CA, Jul. 2007.
"Embedded Multipliers in Cyclone III Devices," Cyclone III Device Handbook, vol. 1, pp. 4-1 through 4-8, Altera Corporation, San Jose, CA, Jul. 2009.
"DSP Blocks in Arria GX Devices," Arria GX Device Handbook, vol. 2, pp. 10-1 through 10-32, Altera Corporation, San Jose, CA, May 2008.

\* cited by examiner

DIGITAL SIGNAL PROCESSING CIRCUITRY WITH REDUNDANCY AND BIDIRECTIONAL DATA PATHS

BACKGROUND OF THE INVENTION

This invention relates to digital signal processing ("DSP") circuitry, and more particularly to arrays of DSP circuit modules or blocks that can optionally work together to perform DSP operations of greater complexity and/or greater mathematical or arithmetic precision, and that when thus needed to work together, can accommodate the possibility that a circuit defect may make a DSP block unusable.

Various circumstances may call for an integrated circuit to be fabricated with multiple instances of blocks or modules of DSP circuitry. An example of such an integrated circuit is a programmable logic device ("PLD") or a field-programmable gate array ("FPGA"). Such a device may have a plurality of rows of various kinds of circuitry, such as relatively general-purpose programmable logic. Each such row may also include a block of DSP circuitry (i.e., circuitry that is hard-wired to at least some degree to perform a particular DSP function or a particular set of DSP functions). It can be desirable in such a situation to size the DSP blocks so that they fit within the (row) boundaries of the other circuitry in the row. This may mean that a DSP block is too small, by itself, to perform some DSP functions that it may be desired for the integrated circuit to perform. In such cases it would be desirable to facilitate optional "stitching together" of multiple DSP blocks in various ways so that larger DSP functions can be efficiently performed in two or more DSP blocks. However, a countervailing concern may be that if any portion of the circuitry associated with DSP blocks that need to be stitched together is not usable (e.g., because of a manufacturing defect in the integrated circuit), that can make it much more difficult or impossible to stitch together those DSP blocks. This may greatly increase the chances that a partly defective integrated circuit cannot be used at all.

SUMMARY OF THE INVENTION

In accordance with certain possible aspects of the present invention, DSP circuit blocks are provided that can more easily work together to perform larger (e.g., more complex and/or more arithmetically precise) DSP operations if desired. For example, such DSP blocks may include routing circuitry for optionally or selectively routing signals to other DSP blocks on either side of each block.

In accordance with other possible aspects of the invention, the inter-DSP-block routing circuitry may also include redundancy capability that enables an outbound signal to go to either of two other DSP blocks to one side of each DSP block, and that enables an inbound signal to come from either of two DSP block to one side of each DSP block. If some DSP block that it is desired to stitch to another DSP block cannot be used (e.g., because of a circuit defect), this redundancy capability allows the stitching together of DSP blocks to take place by effectively skipping over the defective DSP block.

Further features of the invention, its nature and various advantages, will be more apparent from the accompanying drawings and the following detailed description.

DETAILED DESCRIPTION

Figure 1:
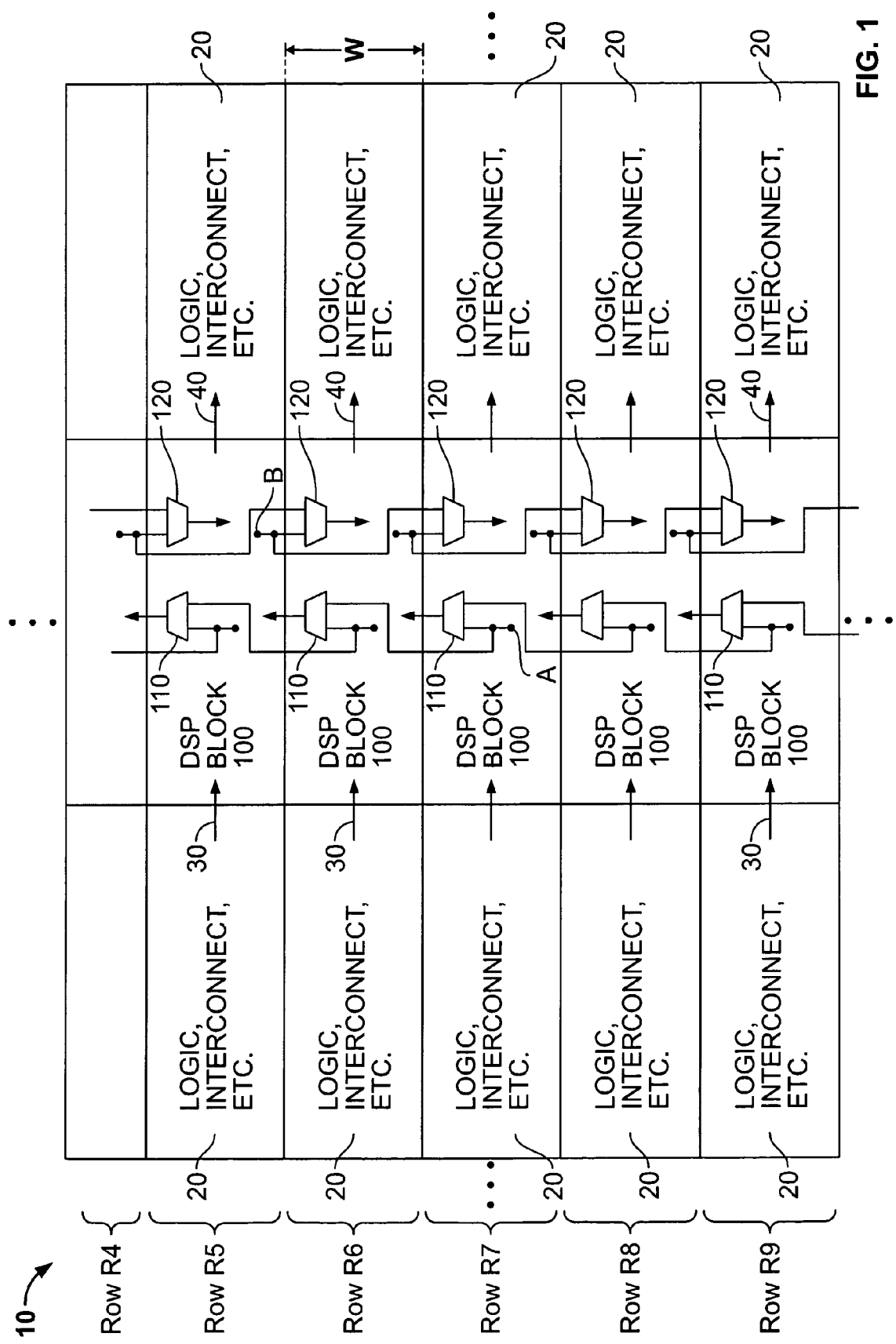
FIG. 1 is a simplified schematic block diagram of an illustrative embodiment of representative circuitry in accordance with the invention.

A representative portion of an illustrative embodiment of an integrated circuit ("IC" or "device") 10 in accordance with the invention is shown in FIG. 1. The circuitry shown in FIG. 1 includes representative portions of several representative rows R4 through R9 of circuitry. Any one of these rows may be referred to generally as row RN.

Each row RN includes a block of digital signal processing or DSP circuitry 100. Each row RN also includes areas of other circuitry 20 to the left and right of the DSP block in that row. That other circuitry 20 may include such components as logic circuitry and interconnection conductors for conveying signals to and from that row's DSP block, and also to, from, and between that row's logic and other circuitry, as well as between the rows. Various aspects of some or all of this circuitry may be programmable, e.g., to enable a generic device 10 to be put to any of several different uses. For example, although the circuitry of DSP blocks 100 is typically hard-wired to some extent to perform certain DSP functions, that circuitry may also be programmable to some extent so that certain aspects of the DSP operations performed can be varied by different users of the device to meet each user's particular needs and requirements. Such programming may be the result of storing control data in memory cells on the integrated circuit, blowing fuses on the integrated circuit, mask programming the integrated circuit, or any other suitable programming technique or technology.

Device 10 may be constructed so that the rows are redundant. This means, for example, that each row RN is identical or substantially identical to all other rows. In addition, device 10 may be constructed so that if any row RN is defective, the row immediately above or below that row can effectively take the place of the defective row. In addition, all other rows above or below the row that is effectively taking the place of the defective row effectively replace other adjacent rows. In this way, many devices 10 that are inadvertently manufactured with some defective circuitry can still be used, which significantly increases the yield of the manufacturing process. FIG. 1 shows representative circuitry for achieving this redundancy in the DSP block areas 100. Additional redundancy circuitry is provided for other portions of each row RN but is not shown in FIG. 1 to avoid over-complicating the drawings (and because those other invention). The DSP block redundancy circuitry will be described in general terms in the next several paragraphs.

In accordance with the present invention, a DSP block 100 can extend its functionality by sending certain signals to and/or receiving certain signals from an adjacent DSP block or blocks. These are relatively direct connections between adjacent DSP blocks 100. These inter-DSP-block connections do not rely on other, more general, interconnection resources of device 10 such as the interconnection resources that form part of circuitry 20. Rather, these inter-DSP-block connections go directly from one DSP block 100 to another adjacent DSP block 100, subject only to the possibility that the redundancy circuitry that will now be described may be employed to allow these inter-DSP-block signals to effectively "jump over" a row that has been taken out of service due to one or more defects in that row.

Considering representative row R7 as an example, a signal that needs to go (in accordance with this invention) from the DSP block 100 in row R7 to another DSP block may originate at node A in the row R7 DSP block. This signal is applied to one selectable input terminal of the multiplexer circuitry ("mux") 110 in that DSP block, and also to one selectable input terminal of the similar mux 110 in the DSP block 100 in the row R6 above row R7. The output signal of mux 110 in row R7 goes to a destination in the DSP block 100 in row R6. The output of mux 110 in row R6 goes to a destination in the DSP block 100 in row R5. If row R6 is not defective and is therefore in use, the mux 110 in row R7 is controlled to select the signal from in row R7 is controlled to select the signal from node A for application to row R6. But if row R6 is defective and is therefore effectively cut out of the circuitry of device 10, then mux 110 in row R6 is controlled to select the signal from node A for application to row R5. This example shows how redundancy muxes 110 can be used to apply a signal from the DSP block 100 in any row to the DSP block 100 in the row immediately above or to the DSP block 100 two rows above the source row.

Redundancy muxes 120 can be used similarly to route a signal from any DSP block 100 to either the DSP block 100 immediately below or the DSP block 100 two rows below. For example, a signal that originates at node B in the DSP block 100 in row R5 is applied to one selectable input of the muxes 120 in each of rows R6 and R7. If row R6 is in use, the mux 120 in row R6 is controlled to apply the signal from node B to the destination in row R6. On the other hand, if row R6 is not in use, then the mux 120 in row R7 is controlled to apply the signal from node B to the destination in row R7.

Figure 2:
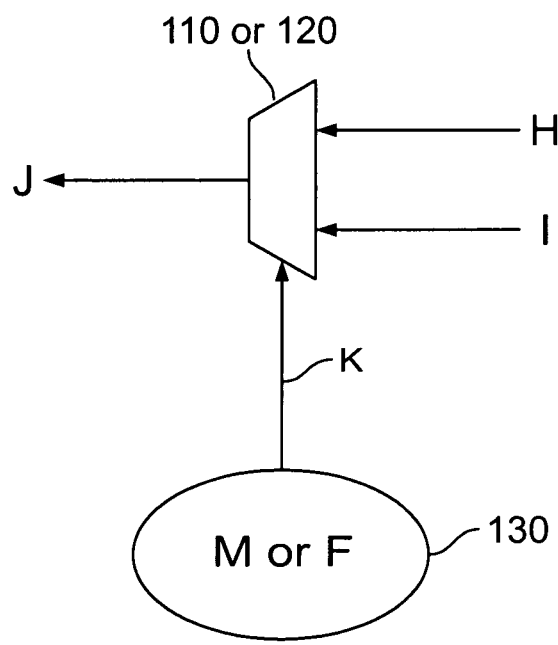
FIG. 2 is a simplified schematic block diagram of an illustrative embodiment of circuitry that can be used in FIG. 1 type circuitry in accordance with the invention.

FIG. 2 shows illustrative embodiments of how a representative redundancy mux 110 or 120 may be controlled. Mux 110/120 can select either of its primary or selectable inputs H or I to be its output signal J based on the logical state of its selection control input signal K. For example, if K is zero, J may be H; and if K is one, J may be I. K may come from a fuse (F) 130 on device 10, memory cell (M) 130 on the device, or any other programmable feature 130 on the device. Such a fuse, memory cell, or the like 130 may be programmed to the appropriate state for each such row RN is defective and must therefore be effectively cut out of device 10 for purposes of normal use of the device.

A point to be made in connection with FIG. 1 is that the width W of each row (between adjacent rows) is approximately the same for (1) the DSP block 100 in that row and (2) the other circuitry 20 in that row. This facilities efficient use of the area on device 10 in a context, like the present one, in which each row is substantially identical to the other rows and in which any row may be completely taken out of service (if defective) and seamlessly replaced by another row. When a row is thus taken out of service and replaced by another row, all functions of the original row are preferably automatically reassigned to the replacement row. The user of the device does not need to be concerned with, or even know, which rows are being used and which row is not being used.

A possible consequence of making the height of each DSP block 100 the same as the height of other circuitry 20 in a row is that it tends to force the size or functional capacity of each DSP block to be commensurate with the size and capacity of the adjacent other circuitry 20 in the row that includes that DSP block. For example, a DSP block 100 may only be able to get a certain number of input signals from the adjacent circuitry 20 in the row that includes that DSP block. This may limit the number and/or size of the DSP operations (e.g., multiplications) the DSP block can perform. However, some users of device 10 may want to perform larger multiplications than can be performed in one such limited DSP block. The present invention therefore provides for extending the multiplication and other capacities of one DSP block 100 by, for example, allowing some portions or aspects of a large multiplication and/or other DSP operation to be performed in another adjacent DSP block 100. In accordance with the present invention, this is done by sending signals substantially directly between adjacent DSP blocks via redundancy circuitry like that shown in general at 110 and 120 in FIG. 1. Substantially direct inter-DSP-block connections are used in this way to avoid the delay and possible other resource exhaustion that might result from instead attempting to use the more general-purpose interconnection resources of other circuitry 20. Redundancy like 110 and 120 is used in these inter-DSP-block interconnections so that if a row must be taken out of service, the signals that need to go from one DSP block 100 to another can bypass the non-functioning DSP block 100 in the row that has been taken out of service.

Figure 3:
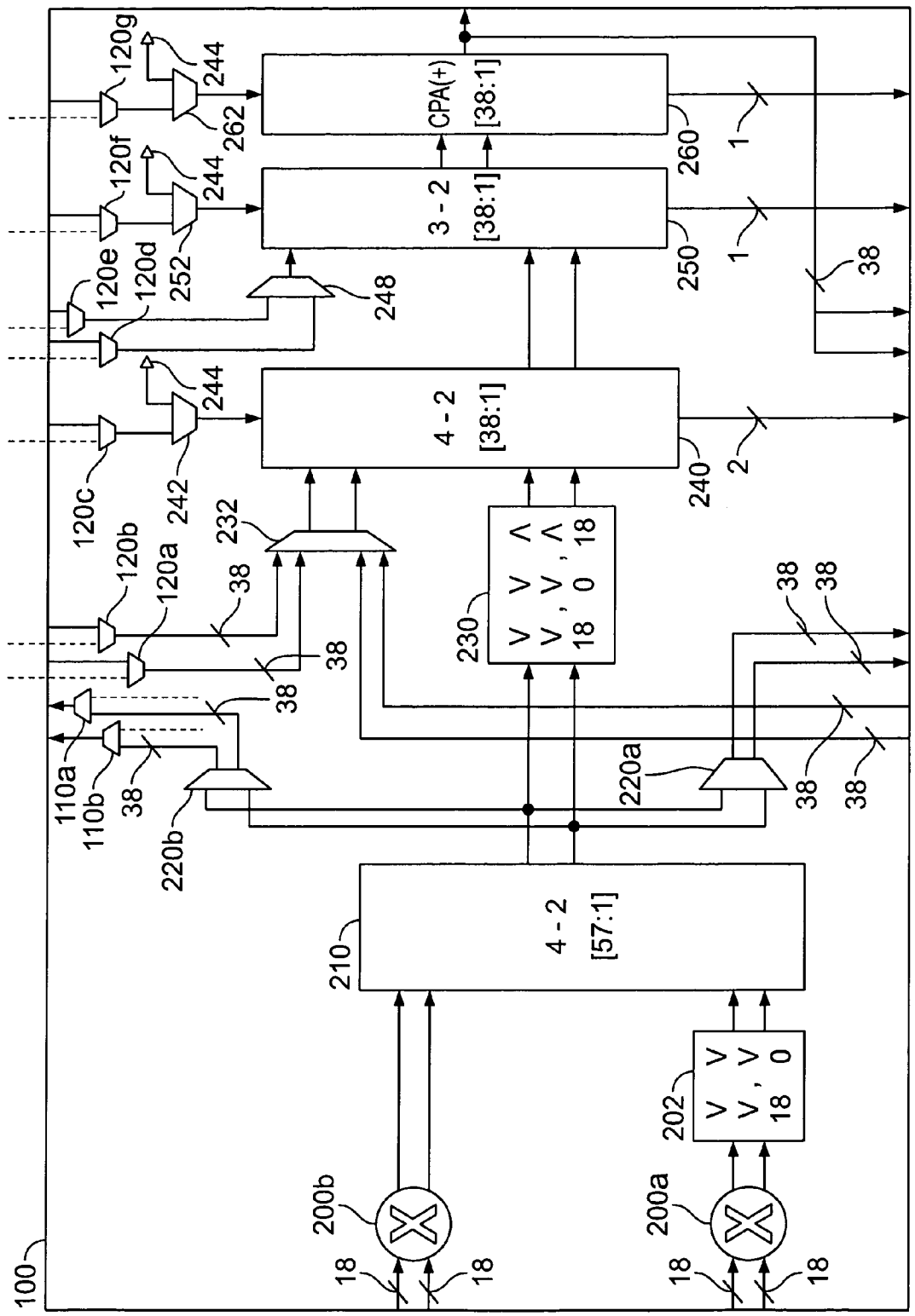
FIG. 3 is a more detailed, but still simplified, schematic block diagram of an illustrative embodiment of a representative portion of circuitry of the type shown in FIG. 1 in accordance with the invention.
Figure 4:
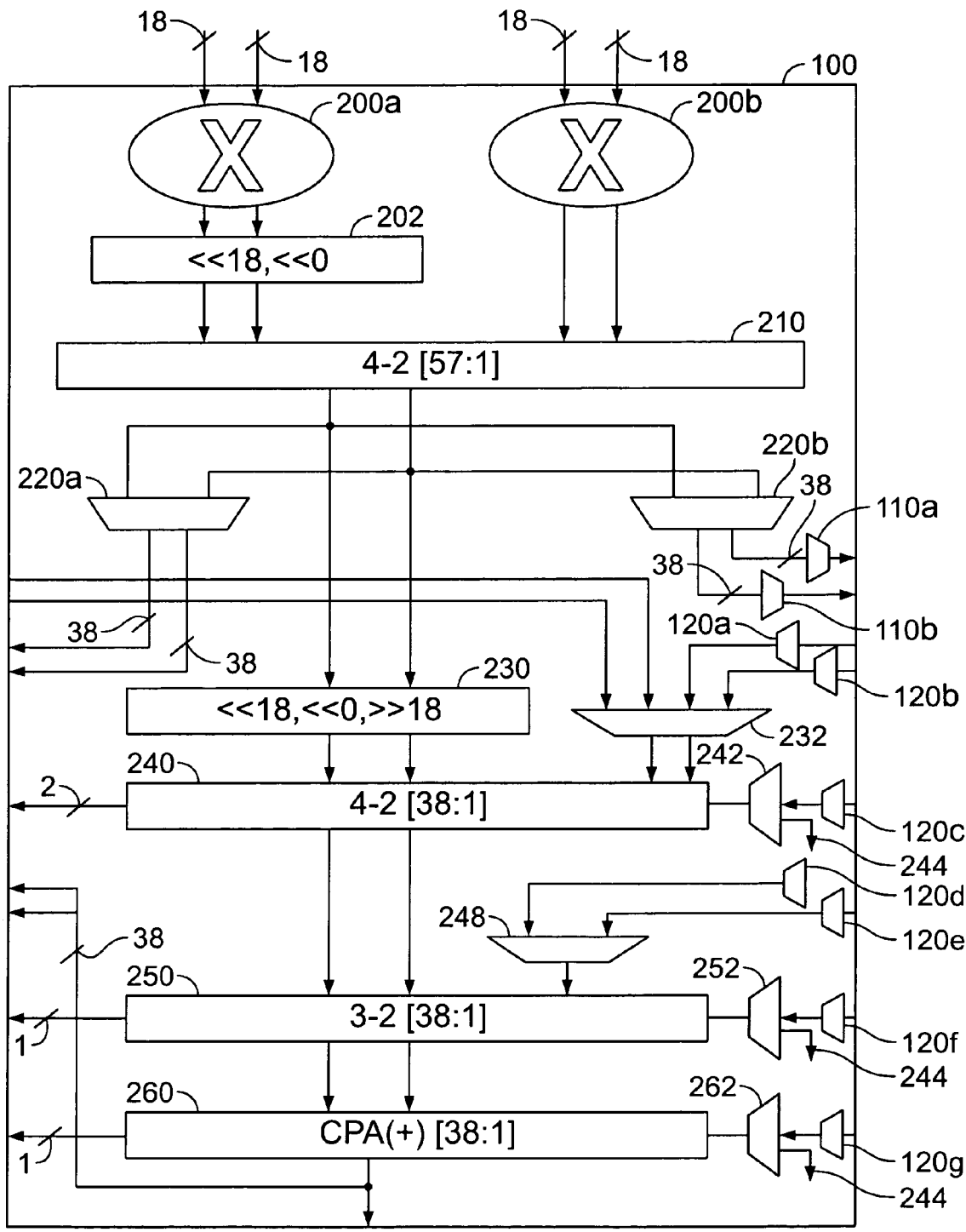
FIG. 4 shows the FIG. 3 circuitry rotated clockwise 90° to facilitate some aspects of discussion of that circuitry.

FIG. 3 shows an illustrative embodiment of a DSP block 100 in accordance with the invention. The various elements of DSP block 100 will be identified early in what follows. More details regarding how these elements can be used will be provided later. FIG. 3 shows representative DSP block 100 in the same orientation as is shown in FIG. 1. However, because this orientation can be difficult to talk about when it comes to explaining arithmetic operations performed by various components of the DSP block, the substance of FIG. 3 is exactly reproduced in a different orientation in FIG. 4. In particular, FIG. 4 is rotated clockwise 90° relative to FIG. 3. Thus "left" or the like in FIG. 4 is the same as "bottom," "down," "below," or the like in FIG. 3; "right" or the like in FIG. 4 is the same as "top," "up," "above," or the like in FIG. 3, etc. FIGS. 1 and 3 make it clear that the above-mentioned substantially direct connections between adjacent DSP blocks 100 go from row to row in device 10. Although FIGS. like FIG. 4 depict a representative DSP block 100 rotated 90°, the following discussion of FIGS. like FIG. 4 will still refer to such inter-DSP-block signals going from one "row" to another "row", even though FIGS. of this kind may make it appear that signals traveling left or right are going into another column of circuitry rather than into another row of circuitry.

Turning now to the basic structure of representative DSP block 100 as shown in either FIG. 3 or FIG. 4, block 100 includes two 18 by 18 ("18×18") multiplier circuits 200a and 200b. Each of multipliers 200 can multiply together two 18-bit data words (represented by electrical data signals from the other circuitry 20 in the row that includes the DSP block 100 under consideration) and produce two product vectors (again represented by electrical signals) in redundant format (e.g., one 36-bit sum vector and one 36-bit carry vector (because the multiplier does not include a final carry-propagate adder ("CPA") for producing a normal final product value)). Controllable shifter circuit 202 is controllable to shift the sum and carry signal vectors output by multiplier 200a either (1) 18 bit positions to the left (increased numerical or arithmetic significance), or (2) not at all (i.e., no shift to the left and therefore no change in numerical or arithmetic significance). Another possible output condition for element 202 may be outputting data signals that are all zeros. As in the case of FIG. 2, one or more fuses or memory cells like 130 may be programmed to control element 202 with respect to whether or not to shift the outputs of multiplier 200a to the left as described above (or, as a third possibility, to output 0 data as mentioned above). As another possible alternative, element 202 may be mask programmable with respect to the function that it performs. In all cases throughout this specification, "shifting" typically means routing signals to a different set of electrical leads going to the next downstream circuit element than the set of electrical leads that would otherwise be used to convey those signals (if not shifted) to the next downstream circuit element. The "arithmetic significance," "bit position," "order," or the like of a bit signal is typically the result of which of several electrical leads that signal is on.

The next element in representative DSP block 100 is four-to-two ("4-2") compressor circuit 210. Compressor 210 can combine the two sum and carry signal vectors it receives from each of shifter 202 and multiplier 200b (i.e., a total of four such signal vectors) down to two such signal vectors. Because the vectors from shifter 202 may be increased in numerical significance by 18 bit positions, the "width" of compressor 210 needs to be increased to 57 bits. Hence compressor 210 is shown having 57 bit positions (i.e., [57:1]).

The sum and carry vectors output by compressor 210 (each vector possibly including as many as 57 bits) are applied to muxes 220a and 220b, and also to controllable shifter circuit 230. Mux circuitry 220a can select any one of various 38-bit circuitry 220a can select any one of various 38-bit subsets of the 57-bit signal vectors output by compressor 210 for application to an adjacent DSP block to the left as viewed in FIG. 4. (Throughout this discussion, the bits in all such 38-bit data values or subsets are of consecutive numerical significance. For example, they may be relatively low-order bits from the 57-bit source; or they may be relatively high-order bits from that source. But in either case, they all have successive bit significance. Selecting such a subset is typically the result of which one of several groups of electrical leads is selected as the source of the signals in the selected subset.) Similarly, mux circuitry 220b can select any one of various 38-bit subsets of the 57-bit vectors output by compressor 210 for application to an adjacent DSP block to the right as viewed in FIG. 4. Muxes 220a and 220b may also have the ability to output data that is all zeros, if desired. This is a capability that any of the muxes (e.g., 220, 232, 242, 248, etc.) and any of the controllable shifters (e.g., 202, 230, etc.) shown and described throughout this disclosure may have. Some muxes (e.g., 242, 252, and 262) are depicted with this capability explicitly shown (e.g., the connection to ground 244 of one set of the selectable inputs to these muxes). This circuitry is not repeated for the depiction of all other elements (e.g., 202, 220, 230, 232, 248, etc.) that may include it (to avoid over-complicating the drawings), nor is this capability expressly mentioned again in the discussion of all of these other elements, but it will be understood that all elements of these general kinds may have this capability.

Controllable shifter 230 can shift bits applied to it by 18 bits to the left (thereby increasing the numerical significance of those bits), or by 18 bits to the right (thereby decreasing the numerical significance of those bits). As a third alternative, shifter 230 may apply no shift to the data applied to it. All of elements 220 and 230 may be controlled by programmable fuse or memory circuit elements like 130 in FIG. 2 (or may be mask programmable) to select which of their various possible functions to perform.

Note that in order to exit the representative DSP block 100 shown in FIGS. 3 and 4, the outputs of muxes 220b must be selected by redundancy muxes 110a and 110b (which are specific instances of redundancy muxes 110 shown more generally or generically in FIGS. 1 and 2). The alternative inputs to muxes 110a and 110b are shown by dotted lines and only in part in FIG. 3 and not at all in FIG. 4 (to avoid over-complicating FIGS. 3 and 4). But it will be apparent from FIG. 1 that these dotted line inputs come from the muxes 220b in the DSP block 100 below the FIG. 3 DSP block (or to the left of the FIG. 4 DSP block).

Muxes 232 receive 38-bit sum and carry vectors from redundancy muxes 120a and 120b. Again, redundancy muxes 120a and 120b are specific instances of the type of redundancy muxes that are shown more generally or generically at 120 in FIG. 1. The solid line inputs to muxes 120a and 120b come from the muxes 220a in the DSP block 100 immediately above the FIG. 3 DSP block (or immediately to the right of the FIG. 4 DSP block). The alternative dotted line inputs to muxes 120a and 120b (shown only in part in FIG. 3 and not at all in FIG. 4 to avoid over-complicating FIGS. 3 and 4) come from the muxes 220a in the DSP block 100 two above the FIG. 3 DSP block (or two to the right of the FIG. 4 DSP block). Muxes 232 also receive 38-bit sum and carry signal vectors from leads that come from the redundancy muxes 110a and 110b in the DSP block 100 immediately below the FIG. 3 DSP block (or immediately to the left of the FIG. 4 DSP block). Muxes 232 can select either the vectors from muxes 120a and 120b or the other vectors that muxes 232 receive. Control of muxes 232 can be similar to control of other variable elements like muxes 220.

The next element in the representative DSP block 100 shown in FIGS. 3 and 4 is 4-2 compressor circuit 240. Although different in size, compressor 240 can be similar to compressor 210. In other words, compressor 240 can combine the four 38-bit sum and carry signal vectors it receives into two, further, 38-bit sum and carry signal vectors. In the event that larger multiplications are being performed, compressor 240 may need to operate in chain-like conjunction with the similar compressor 240 in another adjacent DSP block 100. Accordingly, compressor 240 can additionally receive lower-order (i.e., lower-numerical-significance) signal bits from muxes 242. Muxes 242 can select these lower-order bits from a source of ground potential 244 in the event that there is no chaining-in from a real lower-order source. Alternatively, if there is such chaining-in, then muxes 242 get their outputs from redundancy muxes 120c. Muxes 120c are another instance of muxes like 120a and 120b. The solid line inputs to muxes 120c are the two outputs from compressor 240 in the DSP block 100 immediately above the FIG. 3 block (or immediately to the right of the FIG. 4 block). The dotted line inputs to muxes 120c (shown only in part in FIG. 3 and omitted entirely from FIG. 4 to avoid over-complication of the depictions) are the two outputs from the compressor 240 in the DSP block 100 two above the FIG. 3 block (or two to the right of the FIG. 4 block). The two outputs that come off the bottom (FIG. 3) or left (FIG. 4) of compressor 240 are the most significant, highest order, or overflow output signal bits that result from the operations performed by compressor 240. Again, these overflow bits can be chained to the lowest order inputs of an adjacent DSP block's compressor 240 via muxes 120c and 242 in that adjacent block if larger multiplications are being performed. Muxes 232 are controlled to output 0 data signals in the event that there is no chaining of the DSP blocks.

The 38-bit sum and carry vectors output by compressor 240 are applied to three-to-two ("3-2") compressor circuit 250. The final product output by an adjacent DSP block 100 can also be applied to 3-2 compressor 250 via redundancy muxes 120d and 120e and muxes 248. Again, this inter-DSP-block routing feature can be used when certain more complex DSP operations are to be performed. The arrangement and use of muxes 120d and 120e are similar to the arrangement and use of other such muxes like 120a and 120b. Thus the solid line inputs to muxes 120d and 120e come from the primary outputs of the carry-propagate adder (CPA) circuit 260 in the DSP block 100 above (FIG. 3) or to the right (FIG. 4) of the block shown in FIGS. 3 and 4. The alternative dotted line inputs to redundancy muxes 120d and 120e (again shown only in part in only FIG. 3) come from the primary outputs of the CPA 260 in the DSP block 100 two above (FIG. 3) or two to the right (FIG. 4) of the FIGS. 3 and 4 block. (Muxes 248 are controlled to output 0 data signals in the event that there is no chaining of the DSP blocks.) 3-2 compressor 250 can combine the sum and carry signal vectors from compressor 240 with the data output by muxes 248 to produce further sum and carry signal vectors that are applied to final carry-propagate adder ("CPA") 260. In the event that the representative DSP block 100 is involved in a longer-than-38-bit arithmetic operation, lower-order signal bits can be applied to compressor 250 and CPA 260 from an adjacent DSP block 100 via muxes 120f and 252 in the case of compressor 250 and via muxes 120g and 262 in the case of CPA 260. Similarly, higher-order signal bits can be output from elements 250 and 260 to the elements 120f/252/250 and 120g/262/260 in an adjacent DSP block 100 if needed for chaining multiple elements 250 and multiple elements 260 for longer arithmetic operations. The arrangement and use of elements 120f, 252, and 244 can be similar to the above-described arrangement and use of elements 120c, 242, and 244. The same is true for elements 120g, 262, and 244. Accordingly, further explanation of elements 120f/252/244 and 120g/262/244 should not be needed.

In addition to being substantially directly routable back to muxes 248 in another adjacent DSP block 100, the final, up-to-38-bit signal product output by CPA 260 is typically applied to the other circuitry 20 in the row RN that includes representative DSP block 100 as shown in FIG. 1.

We turn now to considering examples of the various operating modes that one or more DSP blocks 100 can support.

A. 18×18 and 18×18 Complex

Relatively simple modes like 18×18 multiplication and 18×18 complex multiplication (e.g., (a+bi)×(c+di)) can be done within one DSP block 100. For example, either multiplier 200 can be used to form sum and carry signal vectors from an 18×18 multiplication, and those vectors can be passed down through subsequent components to CPA 260, which forms the final product of the multiplication.

B. Sum of Four 18×18

The sum of the products of four 18×18 multiplications can be formed using two adjacent DSP blocks. ("Adjacent" means immediately adjacent if there is no intervening row that has been taken out of service by operation of the redundancy circuitry; or, alternatively, adjacent but for such an intervening out-of-service row.) In discussions such as the following, each letter such as A, B, C, etc., denotes or represents an 18-bit input, and each letter pair like AB, CD, etc., is the multiplication result for a multiplication of the two 18-bit inputs identified by the letters in that pair. Such a letter pair may represent either intermediate sum and carry vectors for such a multiplication result, or the final multiplication product. Thus AB+CD+EF+GH is the sum of four products of eight, paired, 18-bit inputs.

Multiplier 200a in a first DSP block 100 may be used to form AB. Multiplier 200b in that DSP block may be used to form CD. Compressor 210 in the first DSP block forms AB+CD. Muxes 220b can be used to route AB+CD to muxes 232 and compressor 240 in the adjacent DSP block 100. Multiplier 200a in the adjacent DSP block can be used to form EF. Multiplier 200b in that adjacent block can be used to form GH. Compressor 210 in that adjacent block forms EF+GH. Compressor 240 in that adjacent block forms AB+CD+EF+GH, which CPA 260 in that same block outputs in final product form. Note that the block forming AB+CD can be a block to either side of the block forming EF+GH and AB+CD+EF+GH.

C. Sum of Two 36×18

In discussions such as the following, letters like A, B, C, etc., have the same meaning as before; letter pairs like AC, BC, etc., have the same meaning as before; letter pairs like (A,B) denote 36-bit data words in which the letter on the left refers to the 18 more significant bits, and the letter on the right refers to the 18 less significant bits; and letter combinations like (A,B)*C denote the multiplication result for a multiplication of a 36-bit data word (e.g., (A,B)) multiplied by an 18-bit data word (e.g., C). Thus the objective of the mode being discussed here is to produce (A,B)*C+(D,E)*F.

Figure 5:
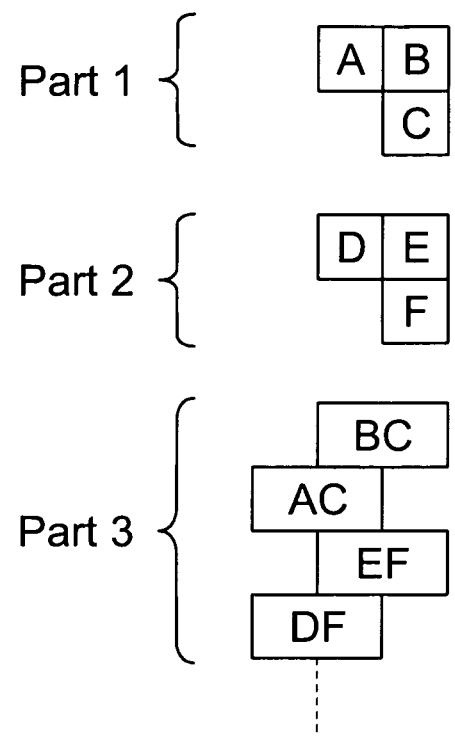
FIG. 5 is a simplified diagram illustrating certain aspects of performance of a particular DSP operation in accordance with the invention.

FIG. 5 shows (arithmetically) how the above-mentioned result is built up. Part 1 of FIG. 5 shows one of the 36×18 multiplications to be performed (i.e., (A,B)*C). Part 2 shows the other of the 36×18 multiplications to be performed (i.e., (D,E)*F). Part 3 shows how various partial products are produced and then aligned vertically for addition to produce (A,B)*C+(D,E)*F. In particular, two partial products of (A,B)*C are produced as AC and BC, with AC being shifted to the left 18 bit positions relative to BC. Similarly, two partial products of (D,E)*F are produced as DF and EF, with DF being shifted 18 bit positions to the left relative to EF. All of BC, AC, EF, and DF are then added as shown in Part 3 of FIG. 5.

Figure 6:
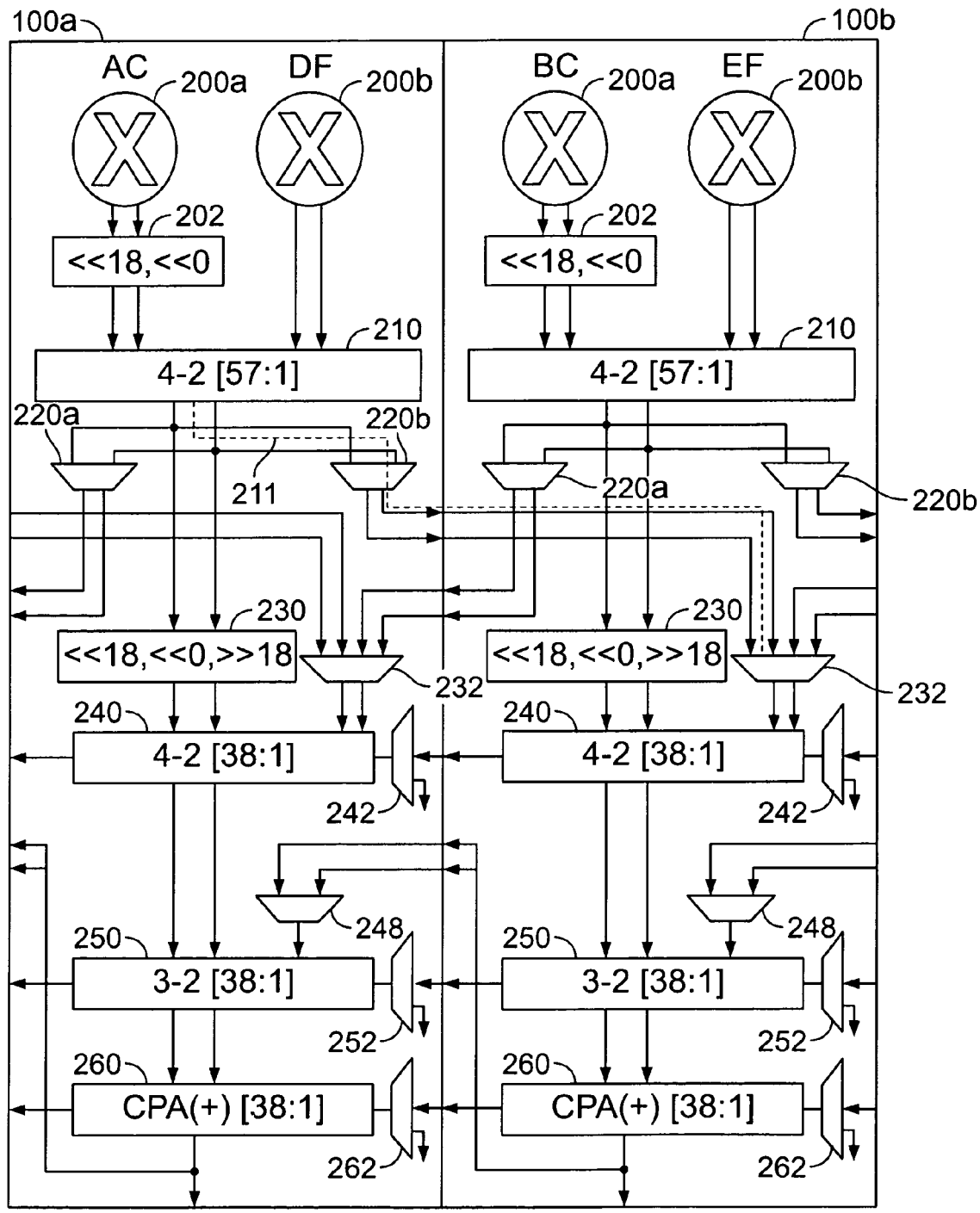
FIG. 6 is a simplified schematic block diagram showing an illustrative embodiment of DSP circuitry for performing the FIG. 5 operation in accordance with the invention.

FIG. 6 shows how two adjacent DSP blocks 100 can be configured to perform the above operations. FIG. 6 is simplified by omitting depiction of the redundancy circuitry and by assuming that two immediately adjacent DSP blocks 100a and 100b are used. (It will be understood that all of the previously depicted and described redundancy circuitry is in fact present in the FIG. 6 circuitry, and that this redundancy circuitry can be used to effectively put together two DSP blocks that are separated from one another by an intervening DSP block that cannot be used.) As shown in FIG. 6, multiplier 200a in DSP block 100a forms AC, multiplier 200b in DSP block 100a forms DF, multiplier 200a in DSP block 100b forms BC, and multiplier 200b in DSP block 100b forms EF. Compressor 210 in block 100a compresses (adds) AC and DF. Compressor 210 in block 100b compresses (adds) BC and EF. The less significant 18 bits of the output of compressor 210 in block 100a are routed via elements 220b (block 100a) and 232 (block 100b) to the compressor 240 in block 100b. (The path of this routing is highlighted by dotted line 211 in FIG. 6.) This enables block 100b to form the portion of the final sum to the right of the dotted line in Part 3 of FIG. 5. The data to the left of the dotted line in Part 3 of FIG. 5 remains in block 100*a* and is output by that block as that part of the final sum.

More particularly, in block 100*a*, shifter 230 is used to shift the outputs of compressor 210 18 bit positions to the right so that the more significant outputs of compressor 210 that are not transferred to block 100*b* are shifted to the less significant portion of compressor 240 in block 100*a*. In block 100*b* shifter 230 shifts the data from compressor 210 18 bit positions to the left, and the data passing through mux circuitry 232 in block 100*b* is applied to the more significant inputs to compressor 240 that are associated with that mux circuitry 232. The compressor 240 in block 100*b* is thus able to begin finishing the addition shown to the right of the dotted line in Part 3 of FIG. 5. Any carry out or overflow from the most significant end of compressor 240 in block 100*b* is applied by muxes 242 in block 100*a* to the least significant end of compressor 240 in block 100*a*. This enables both compressors 240 to effectively operate together as one much longer compressor.

The data output by each of compressors 240 flows through the respectively associated compressor 250 to the respectively associated carry-propagate adder ("CPA") 260, where the final sum-out data for (A,B)*C+(D,E)*F is produced. Again, any carry overflow from the most significant end of CPA 260 in block 100*b* is applied (as a carry in) to the least significant end of CPA 260 in block 100*a* via mux 262 in block 100*a*. This again enables both of CPAs 260 to effectively operate together as one much longer CPA. Thus block 100*a* outputs the 18 more significant bits of final product (A,B)*C+(D,E)*F, while block 100*b* outputs the 36 less significant bits of that final product.

D. 36×36 Mode Using Two DSP Blocks

In discussions such as the following, letter pairs like (A,B) again denote a 36-bit data word in which the letter on the left refers to the 18 more significant bits, and the letter on the right refers to the 18 less significant bits. Letter pairs like BD also have basically the same meaning as before (although now such a letter pair typically refers to the product of two 18-bit portions of two different 36-bit data words). Thus the objective of the work being discussed in this section is to produce the product of (A,B) and (C,D), or (A,B)*(C,D).

Figure 7:
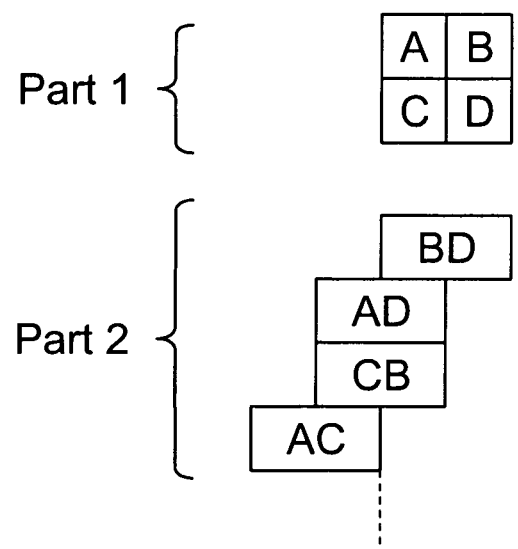
FIG. 7 is a simplified diagram illustrating certain aspects of performance of another DSP operation in accordance with the invention.

FIG. 7 shows arithmetically how the above-mentioned result is built up. Part 1 of FIG. 7 shows the multiplication to be performed. Part 2 shows four partial products that are formed, and how these four partial products are positioned, left to right, relative to one another to adjust their relative arithmetic significances so that they can be added vertically. In particular, the topmost partial product BD is the product of the 18 less significant bits in each of multiplicand (A,B) and multiplier (C,D). The next partial product AD is the product of the 18 more significant bits in the multiplicand (A,B) and the 18 less significant bits in the multiplier (C,D). Partial product CB is the product of the 18 less significant bits in multiplicand (A,B) and the 18 more significant bits in multiplier (C,D). Partial product AC is the product of the 18 more significant bits in each of the multiplicand and the multiplier. As has already been mentioned, Part 2 of FIG. 7 also shows how partial products AD and CB are shifted 18 bit positions to the left relative to partial product BD, as well as how partial product AC is shifted 18 more bit positions to the left relative to partial products AD and CB. After such shifting, the four partial products shown in Part 2 of FIG. 7 can be added vertically to produce the desired final product of (A,B) and (C,D), i.e., (A,B)*(C,D).

Figure 8:
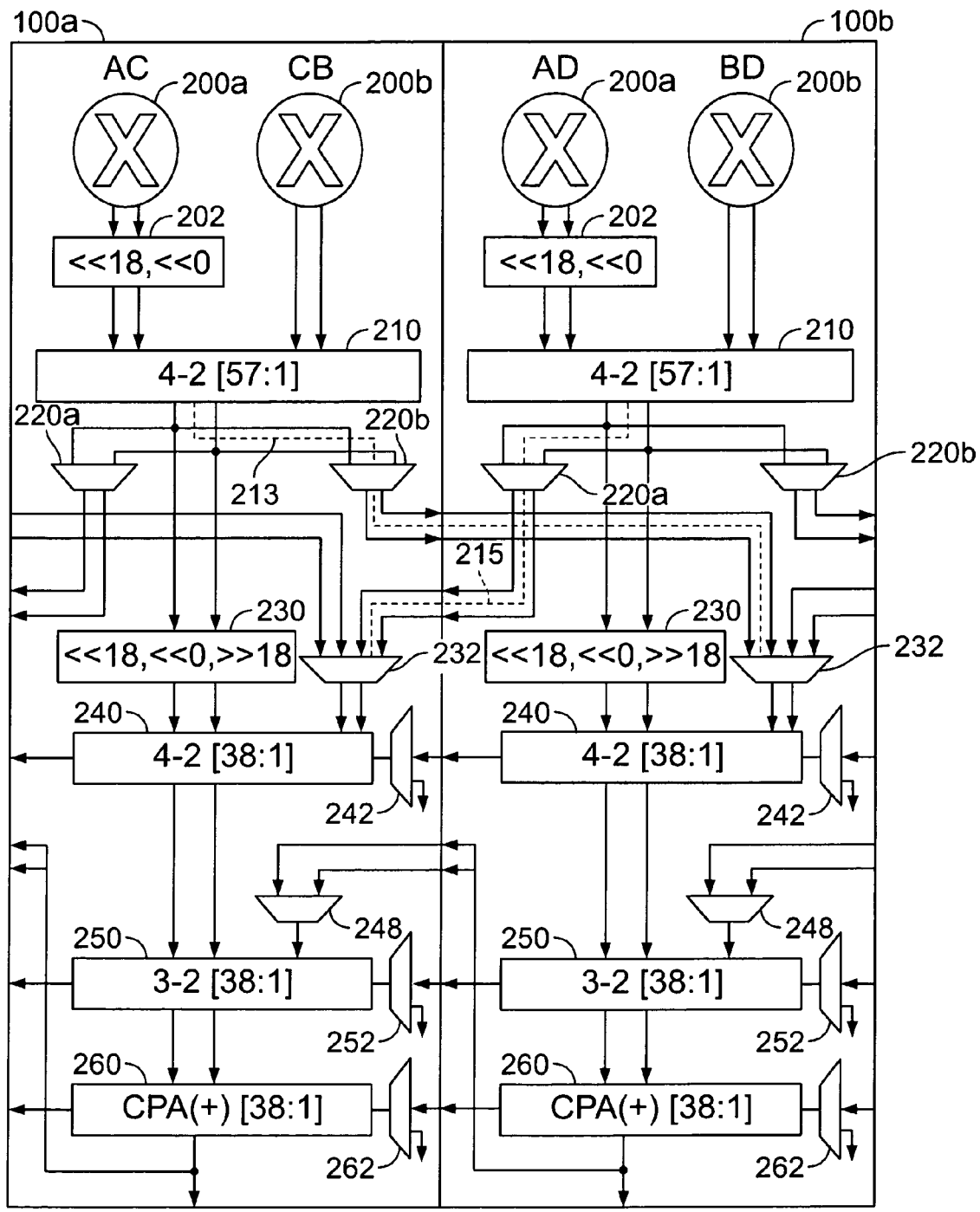
FIG. 8 is a simplified schematic block diagram showing an illustrative embodiment of DSP circuitry for performing the FIG. 7 operation in accordance with the invention.

Two adjacent DSP blocks 100 can be used to perform the arithmetic functions illustrated by FIG. 7. (Again "adjacent" means either immediately adjacent if no intervening row has been taken out of service, or adjacent on opposite sides of an intervening row that has been taken out of service.) FIG. 8 shows how this can be done using two adjacent DSP blocks 100*a* and 100*b* (and again omitting depiction of the redundancy multiplexers and other redundancy connections to avoid unduly complicating the FIG.).

As shown in FIG. 8, multiplier 200*a* in DSP block 100*a* forms partial product AC. Multiplier 200*b* in DSP block 100*a* forms partial product CB. Multipliers 200*a* and 200*b* in DSP block 100*b* form partial products AD and BD, respectively. Shifter 202 in DSP block 100*a* shifts partial product AC 18 bit positions to the left relative to partial product CB, and compressor 210 in that DSP block adds those two partial products as thus shifted relative to one another. Shifter 202 in DSP block 100*b* shifts partial product AD 18 bit positions to the left relative to partial product BD, and compressor 210 in that DSP blocks adds those two partial products as thus shifted relative to one another.

The 18 least significant bits output by the compressor 210 in DSP block 100*a* are routed via elements 220*b* in block 100*a* and 232 in block 100*b* to compressor 240 in block 100*b*, where these bits are routed to the more significant end of the associated compressor 240 inputs. (Dotted line 213 highlights this routing.) The 18 most significant bits output by compressor 210 in DSP block 100*b* are routed via elements 220*a* in block 100*b* and 232 in block 100*a* to compressor 240 in block 100*a*, where these bits are routed to the less significant end of the associated compressor inputs. (Dotted line 215 highlights this routing.) Shifter 230 in DSP block 100*a* shifts the data output by compressor 210 in that block 18 bits to the right to prevent the less significant bits that have been transferred from block 100*a* to block 100*b* from also being applied to compressor 240 in block 100*a*. Shifter 230 in DSP block 100*b* shifts the data output by compressor 210 in that block 18 bits to the left in order to prevent the more significant bits that have been transferred from block 100*b* to block 100*a* from also being applied to compressor 240 in block 100*b*.

Compressors 240 in DSP blocks 100*a* and 100*b* work together to add the partial product information applied to them (with element 242 in block 100*a* applying any overflow from the highest-order (most-significant) bit position in compressor 240 in block 100*b* to the lowest-order (least-significant) bit position in compressor 240 in block 100*a*). Compressor 240 in block 100*a* is thus beginning to form the result of addition of data to the left of the vertical dotted line in Part 2 of FIG. 7, while compressor 240 in block 100*b* is performing similarly for the data to the right of that dotted line.

The data output by each of compressors 240 flows through the respective compressor 250 to the respective carry-propagate adder ("CPA") 260. Again, element 262 in block 100*a* applies any carry out from the most significant end of CPA 260 in block 100*b* to the least significant end of CPA 260 in block 100*a*. The final outputs of these two CPAs 260 collectively comprise the final product (A,B)*(C,D), with the outputs of CPA 260 in block 100*a* constituting the more significant bits of that final product, and with the outputs of CPA 260 in block 100*b* constituting the less significant bits of that final product.

E. 54×54 Mode Using Four DSP Blocks

Figure 9:
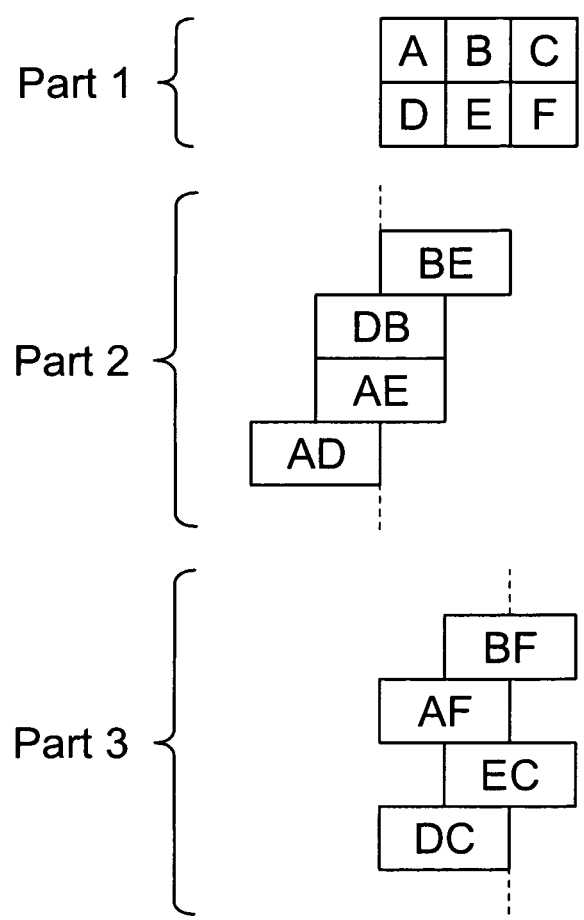
FIG. 9 is a simplified diagram illustrating certain aspects of performance of yet another DSP operation in accordance with the invention.
Figure 10:
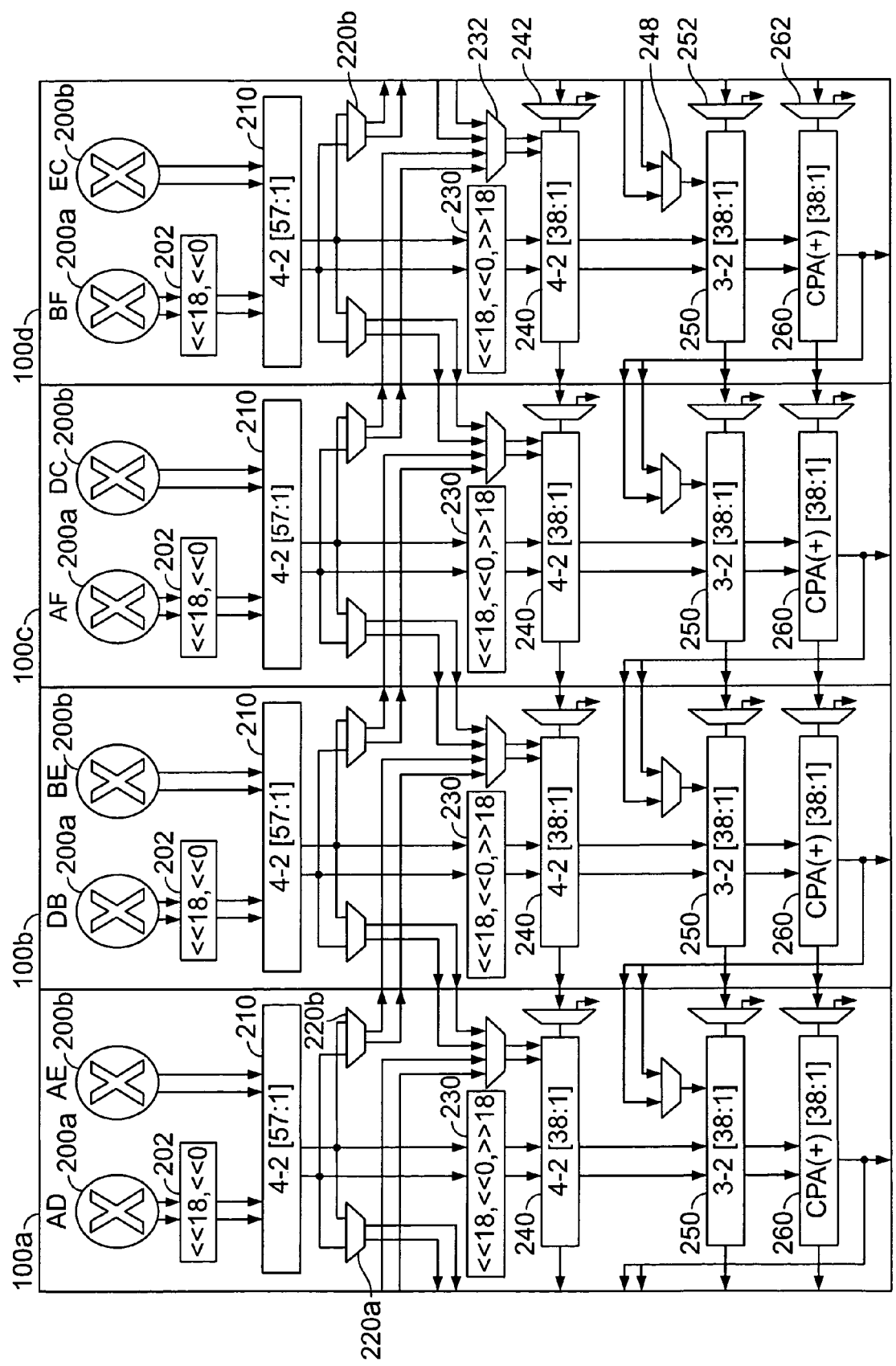
FIG. 10 is a simplified schematic block diagram showing an illustrative embodiment of DSP circuitry for performing the FIG. 9 operation in accordance with the invention.

Another example of how DSP blocks 100 in accordance with this invention can be used is illustrated by FIGS. 9 and 10. In this discussion letter triplets like (A,B,C) refer to 54-bit data words in which letter A denotes the 18 most-significant bits, letter B denotes the 18 bits of intermediate arithmetic significance, and letter C denotes the 18 least-significant bits. Letter pairs like AF refer to a partial product of 18 bits A from one 54-bit data word times 18 bits F from another 54-bit data word. The objective of the mode being discussed in this section is to produce the product of two 54-bit data words, i.e., the product of (A,B,C) times (D,E,F), or (A,B,C)*(D,E,F). It is assumed, however, that exact precision for 108 bits is not required for the product. Accordingly, the least significant partial product CF is not computed or used to produce the final (approximate) product.

FIG. 9 shows arithmetically how the above-mentioned product is built up from multiple partial products. FIG. 10 shows four DSP blocks 100a-100d that can be used to build up the product as shown in FIG. 9. (Again, for simplicity, FIG. 10 assumes that four immediately adjacent DSP blocks 100 can be used because no DSP block in this range is out of service. Thus FIG. 10 omits depiction of the redundancy circuitry shown and described elsewhere in this specification. But that redundancy circuitry is preferably present and can be used to enable another adjacent DSP block 100 to be used to help perform the functions described in connection with FIG. 10 if one of blocks 100a-d must be taken out of service.) Part 1 of FIG. 9 shows the multiplication to be performed. Part 2 of FIG. 9 shows the partial products that are formed and appropriately combined in the two left-hand DSP blocks 100a and 100b. Part 3 of FIG. 9 shows the partial products that are formed and appropriately combined in the two right-hand DSP blocks 100c and 100d. The 36 more significant bits from Part 3 of FIG. 9 (i.e., the bits to the left of the dotted line in Part 3) are added to the 36 less significant bits from Part 2 of FIG. 9 (i.e., the bits to the right of the dotted line in Part 2), primarily in the final stages of DSP block 100b. Thus the 72 more significant bits of the product are output by DSP blocks 100a and 100b. An additional 18 less significant bits of the product are available from DSP block 100d. As mentioned earlier, still less significant bits of the product are not computed and are not available. Thus the "product" in this case is only approximate, although it is approximate to a very high degree of precision. In particular, this is due to the fact that the least significant partial product CF is not computed or used anywhere in FIGS. 9 and 10.

Considering FIGS. 9 and 10 now in more detail, it will be noted that the work done in DSP blocks 100a and 100b (as shown in Part 2 of FIG. 9) is initially the same as what is shown in FIGS. 7 and 8 and described above in connection with those FIGS. In particular, this work is use of two DSP blocks 100a and 100b to form the product of two 36-bit data words (in this case the product (A,B)*(D,E)). Because this aspect of the functionality of two DSP blocks has already been fully described in connection with FIGS. 7 and 8, it will not be necessary to describe it in detail again in connection with Part 2 of FIG. 9 or DSP blocks 100a and 100b in FIG. 10.

Turning now to Part 3 of FIG. 9 and DSP blocks 100c and 100d in FIG. 10, it will be noted that the work done in these two DSP blocks is initially somewhat similar to what is shown in FIGS. 5 and 6 and described above in connection with those FIGS. However, the dotted line in Part 3 of FIG. 9 is in a different location than the dotted line in Part 3 of FIG. 5, so the way in which DSP blocks 100c and 100d in FIG. 10 do this work is somewhat different than the flow described above for FIG. 6. The somewhat different flow used in FIG. 10 will be described in the next paragraph.

Multipliers 200a and 200b in DSP block 100c form partial products AF and DC, respectively. Compressor 210 in block 100c adds these two partial products together. Multipliers 200a and 200b in DSP block 100d form partial products BF and EC, and the compressor 210 in that block adds these two partial products together. Routing 220a in block 100d and 232 in block 100c applies the 18 more significant bits output by compressor 210 in block 100d to the less significant end of compressor 240 in block 100c. Shifter 230 in block 100d shifts the outputs of the compressor 210 in that block 18 bit positions to the left. Compressor 240 in block 100c compresses the four vectors applied to it down to two vectors, which flow down through the compressor 250 in that block to the CPA 260 in that block. (This is basically the final addition work required to the left of the dotted line in Part 3 of FIG. 9.) The outputs of compressor 240 in block 100d similarly flow down through the compressor 250 in that block to the CPA 260 in that block. (This corresponds to what is to the right of the dotted line in Part 3 of FIG. 9.) The CPAs 260 in blocks 100c and 100d work together to produce the final sum of the work shown in Part 3 of FIG. 9. Elements 248 in block 100b are used to route the 38 more significant bits of that result (output by the CPA 260 in block 100c) into block 100b for addition to the work being done in blocks 100a and 100b (as shown in Part 2 of FIG. 9). Thus the final result is (1) the 72 more significant bits of (A,B,C)*(D,E,F) being output by the CPAs 260 in blocks 100a and 100b, and (2) the 18 more (less significant) bits of that (approximate) product being output by the CPA 260 in block 100d.

Recapitulating some aspects of the foregoing, and also in some respects extending what has been said, a digital signal processing ("DSP") block (e.g., 100) may include first and second N-bit (e.g., 18-bit) multiplier circuits (e.g., 200a and 200b). The DSP block may further include first shifter circuitry (e.g., 202) for shifting outputs of the first multiplier circuit by a selectable one of (1) zero bit positions and (2) N bit positions toward greater arithmetic significance. The DSP block may still further include first compressor circuitry (e.g., 210) for additively combining outputs of the first shifter circuitry and the second multiplier circuit. The DSP block may yet further include circuitry (e.g., 220a and 220b) for selectively routing outputs of the first compressor circuitry to first and second other DSP circuit blocks that are on respective opposite sides of the DSP circuit block. The DSP block may still further include second shifter circuitry (e.g., 230) for shifting outputs of the first compressor circuitry by a selectable one of (1) zero bit positions, (2) N bit positions toward greater arithmetic significance, and (3) N bit positions toward lesser arithmetic significance. The DSP block may yet further include second compressor circuitry (e.g., 240) for additively combining any outputs received from the first compressor circuitry in either of the first and second other DSP circuit blocks.

In a DSP circuit block as described above, the routing circuitry (e.g., 220a and/or 220b) may be controllable to select for routing any one of a plurality of subsets of the outputs of the first compressor circuitry (e.g., 210). These selectable subsets may include (1) a subset including a most significant output bit position of the first compressor circuitry, and (2) a subset including a least significant output bit position of the first compressor circuitry.

In a DSP circuit block as described above the second compressor circuitry (e.g., 240) may include overflow output circuitry (e.g., output leads from most significant end of compressor 240 to adjacent DSP block) for applying overflow output signals of the second compressor circuitry to the first other DSP circuit block, and overflow input circuitry (e.g., 242) for selectively receiving overflow output signals of the second compressor circuitry in the second other DSP circuit block.

A DSP circuit block as described above may further include third compressor circuitry (e.g., 250) for additively combining outputs of the second compressor circuitry and any further outputs received from the second other DSP circuit block, and further routing circuitry (e.g., 248) for selectively routing outputs of the third compressor circuitry, as further outputs, to the first other DSP circuit block. In such a DSP circuit block, the third compressor circuitry (e.g., 250) may comprise overflow output circuitry (e.g., output leads from most significant end of compressor 250 to adjacent DSP block) for applying overflow output signals of the third compressor circuitry to the first other DSP circuit block, and overflow input circuitry (e.g., 252) for selectively receiving overflow output signals of the third compressor circuitry in the second other DSP circuit block.

In a DSP circuit that includes the above-mentioned further routing circuitry (e.g., 248), that further routing circuitry may include carry-propagate adder ("CPA") circuitry (e.g., 260) for operating on the outputs of the third compressor circuitry (e.g., 250) to produce the further outputs. The CPA circuitry may include carry-out circuitry (e.g., output lead from most significant end of CPA 260 to adjacent DSP block) for applying a carry out signal of the CPA circuitry to the first other DSP circuit block, and carry-in circuitry (e.g., 262) for selectively receiving a carry out signal of the CPA circuitry in the second other DSP circuit block.

A DSP circuit block as described above may further include redundancy circuitry (e.g., 110 and/or 120) for allowing the first other DSP circuit block to be a selectable one of (1) another DSP circuit block that is immediately adjacent to the DSP circuit block, and (2) yet another DSP circuit block that is not immediately adjacent to the DSP circuit block. For example, if the DSP circuit block is in row R7 in FIG. 1, the first other DSP block can be either (1) in row R8 or (2) in row R9. In such an arrangement the yet another DSP circuit block (e.g., the one in row R9) is immediately adjacent to the another DSP circuit block (e.g., the one in row R8).

A DSP circuit block as described above may also include further redundancy circuitry (e.g., 110 and/or 120) for allowing the second other DSP circuit block to be a selectable one of (1) still another DSP circuit block that is immediately adjacent to the DSP circuit block, and (2) still a further other DSP circuit block that is not immediately adjacent to the DSP circuit block. For example, if the DSP circuit block is in row R7 in FIG. 1, the second other DSP block can be either (1) in row R6 or (2) in row R5. In such an arrangement the still a further other DSP circuit block (e.g., the one in row R5) is immediately adjacent to the still another DSP circuit block (e.g., the one in row R6).

In accordance with other possible aspects of the invention, DSP circuitry (e.g., 10) may comprise a plurality of DSP circuit blocks (e.g., 100), each of which is capable of performing DSP operations (e.g., 200, 202, 210, 230, 240, etc.) on signals applied to that circuit block (e.g., A, B, C, etc.), each of the DSP circuit blocks may include circuitry (e.g., 220, 232, 242, etc.) for selectively routing outputs of at least some of the DSP operations to first and second other ones of the DSP circuit blocks that are on respective opposite sides of the DSP circuit block. In such cases, the circuitry for selectively routing may include redundancy circuitry (e.g., 110 and/or 120) for allowing the first other DSP circuit block for a DSP circuit block to be a selectable one of (1) another DSP circuit block that is immediately adjacent to that DSP circuit block, and (2) yet another DSP circuit block that is not immediately adjacent to that DSP circuit block. For example, if the DSP circuit block is in row R7 in FIG. 1, the first other DSP block can be either (1) in row R8 or (2) in row R9. In such an arrangement the yet another DSP circuit block (e.g., the one in row R9) is immediately adjacent to the another DSP circuit block (e.g., the one in row R8).

The circuitry for selectively routing in DSP circuitry as described above may further include further redundancy circuitry (e.g., 110 and/or 120) for allowing the second other DSP circuit block for a DSP circuit block to be a selectable one of (1) still another DSP circuit block that is immediately adjacent to that DSP circuit block, and (2) still a further other DSP circuit block that is not immediately adjacent to that DSP circuit block. For example, if the DSP circuit block is in row R7 in FIG. 1, the second other DSP block can be either (1) in row R6 or (2) in row R5. In such an arrangement the still further other DSP circuit block (e.g., the one in row R5) is immediately adjacent to the still another DSP circuit block (e.g., the one in row R6).

In DSP circuitry as described above, the circuitry for selectively routing of each of the DSP circuit blocks may selectively route the outputs to inputs of the first and second other ones of the DSP circuit blocks that are downstream from some but not all DSP operations that the first and second other ones of the DSP circuit blocks are capable of performing. For example, selective routing circuitry 220 can route outputs of compressor 210 in one DSP block to inputs of a compressor 240 in another DSP block, and compressor 240 is downstream from some (but not all) other DSP operations in the other DSP block (e.g., it is downstream from operations 200, 202, 210, and 230, but it is upstream from operations 250 and 260).

In accordance with still other possible aspects of the invention, DSP circuitry (e.g., 10) may include a plurality of DSP circuit blocks (e.g., 100), each of which is capable of performing a plurality of DSP operations (e.g., 200, 202, 210, 230, 240, etc.) one after another in succession. Each of the DSP circuit blocks may further include circuitry (e.g., 220) for selectively routing outputs of at least one of the DSP operations (e.g., 210) of that DSP circuit block to first and second other ones of the DSP circuit block that are on respective opposite sides of that DSP circuit block. The circuitry for selectively routing in each DSP circuit block may selectively route at least some of the outputs to inputs to DSP operations in the first and second other DSP circuit blocks that are intermediate in the succession of DSP operations in those other DSP circuit blocks. For example, routing circuitry 220 can route outputs of a DSP block to inputs of compressor 240 in another DSP block, and compressor 240 is intermediate in the succession of DSP operations (i.e., it is preceded by DSP operations like 200 and 202, and it is followed by DSP operations like 250 and 260).

In DSP circuitry as described above, at least some of the inputs may be inputs to DSP operations at a different point in the succession in the DSP blocks than the point in the succession in the DSP circuit block from which the circuitry for selectively routing received the outputs selectively routed to those at least some inputs. For example, compressor 210, from which routing elements 220 get outputs to apply to compressor 240 in another DSP block, is at a different point in the succession of DSP operations in the first-mentioned DSP block than the point at which compressor 240 is in the succession of DSP operations in the second-mentioned DSP block.

In DSP circuitry as described above, each DSP circuit block may further include second circuitry (e.g., the lead from the most significant end of compressor 240 to an adjacent DSP block) for selectively routing a second output of a DSP operation in that DSP circuit block to an input of a same DSP operation in the first other DSP circuit block. For example, the immediately above-mentioned lead and element 242 allows overflow signals to go from the compressor 240 in one DSP block to the compressor 240 in another DSP block.

In DSP circuitry as described above, each DSP circuit block may further include third circuitry (e.g., 248) for selectively routing outputs of a final DSP operation (e.g., 260) in that DSP circuit block to inputs to a DSP operation (e.g., 250) in the first other DSP circuit that is at an intermediate point in the succession in that other DSP circuit block.

DSP circuitry as described above may further include redundancy circuitry (e.g., 110 and/or 120) for allowing the first other DSP circuit block of each of the DSP circuit blocks to be a selectable one of (1) another of the DSP circuit blocks that is immediately adjacent to the DSP circuit block, and (2) yet another of the DSP circuit blocks that is not immediately adjacent to the DSP circuit block. For example, if a DSP block 100 is in row R7 in FIG. 1, the another DSP block may be in row R8 and the yet another DSP block may be in row R9. In addition, the yet another DSP block (e.g., the one in row R9) may be immediately adjacent to the another DSP block (e.g., the one in row R8).

DSP circuitry as described above may also include further redundancy circuitry (e.g., 110 and/or 120) for allowing the second other DSP circuit block of each of the DSP circuit blocks to be a selectable one of (1) still another of the DSP circuit blocks that is immediately adjacent to the DSP circuit block, and (2) still a further another one of the DSP circuit blocks that is not immediately adjacent to the DSP circuit block. For example, if the DSP circuit block is in row R7 in FIG. 1, the still another DSP block may be in row R6, and the still a further another DSP block may be in row R5. The still a further another one of the DSP circuit blocks (e.g., the one in row R5) may be immediately adjacent to the still another of the DSP circuit blocks (e.g., the one in row R6).

The circuitry of this invention allows summations to be performed by bidirectional shifting between DSP circuit blocks. For example, a value can be shifted from a first DSP block to a second DSP block to the right of the first block and combined (e.g., compressed) with another signal in the second block. The result of this combination can then be shifted back to the left (i.e., to the first block) and combined with other signals in the first block. This shifting back can occur (for example) through (1) the carry vectors from compressor to compressor (compressors 240 or compressors 250), (2) the carry bit of the CPA 260, or (3) the output of the CPA 260 to the 3-2 compressor 250.

Any of the multiplexers employed in the DSP circuitry of this invention can be of the type that can selectively (i.e., controllably) output zero (0) data. This also includes any of the controllable shifters employed herein.

It will be understood that the foregoing is only illustrative of the principles of the invention, and that various modifications can be made by those skilled in the art without departing from the scope and spirit of the invention. For example, the use of 18×18 multipliers 200 is only illustrative, and other sizes of multipliers can be used instead, if desired. It will also be understood that the FIGS. herein like FIGS. 1-4, 6, 8, and 10 show electronic circuitry in which most or all of the circuit elements (like 200, 202, 210, 220, 260, etc.) are separate elements (typically integrated together on an integrated circuit), each of which elements is dedicated (e.g., hard-wired to at least a significant extent) to performing the function(s) described for it herein by operating on electrical input signals to produce other electrical output signals. These electrical signals may sometimes be referred to as data, bits, vectors, "1", "0", values, multiplicand, multiplier, product, partial product, sum, or the like; but in all cases they are in fact actual electrical signals representing the specified information. Similarly, certain of the electrical circuit elements shown herein may sometimes be referred to by the operations they perform (e.g., "multiplier 200*a*"), but in all cases these elements are actual electrical circuitry (e.g., multiplier circuitry) performing those operations. The same is true for references to DSP circuitry, DSP operations, or the like. All such operations are performed by electrical circuitry operating on electrical signals as mentioned above.

What is claimed is:

1. A digital signal processing ("DSP") circuit block comprising:
    first and second N-bit multiplier circuits;
    first shifter circuitry for shifting outputs of the first multiplier circuit by a selectable one of (1) zero bit positions and (2) N bit positions toward greater arithmetic significance;
    first compressor circuitry for additively combining outputs of the first shifter circuitry and the second multiplier circuit;
    circuitry for selectively routing outputs of the first compressor circuitry to first and second other DSP circuit blocks that are on respective opposite sides of the DSP circuit block;
    second shifter circuitry for shifting outputs of the first compressor circuitry by a selectable one of (1) zero bit positions, (2) N bit positions toward greater arithmetic significance, and (3) N bit positions toward lesser arithmetic significance; and
    second compressor circuitry for additively combining outputs of the second shifter circuitry and any outputs received from the first compressor circuitry in either of the first and second other DSP circuit blocks.

2. The DSP circuit block defined in claim 1 wherein the routing circuitry is controllable to select for routing any one of a plurality of subsets of the outputs of the first compressor circuitry.

3. The DSP circuit block defined in claim 2 wherein the selectable subsets include (1) a subset including a most significant output bit position of the first compressor circuitry, and (2) a subset including a least significant output bit position of the first compressor circuitry.

4. The DSP circuit block defined in claim 1 wherein the second compressor circuitry comprises:
    overflow output circuitry for applying overflow output signals of the second compressor circuitry to the first other DSP circuit block; and
    overflow input circuitry for selectively receiving overflow output signals of the second compressor circuitry in the second other DSP circuit block.

5. The DSP circuit block defined in claim 1 further comprising:
    third compressor circuitry for additively combining outputs of the second compressor circuitry and any further outputs received from the second other DSP circuit block; and
    further routing circuitry for selectively routing outputs of the third compressor circuitry, as further outputs, to the first other DSP circuit block.

6. The DSP circuit block defined in claim 5 wherein the further routing circuitry is alternatively able to output data that is all zeros.

7. The DSP circuit block defined in claim 5 wherein the third compressor circuitry comprises:
    overflow output circuitry for applying overflow output signals of the third compressor circuitry to the first other DSP circuit block; and overflow input circuitry for selectively receiving overflow output signals of the third compressor circuitry in the second other DSP circuit block.

8. The DSP circuit block defined in claim 5 wherein the further routing circuitry comprises:
carry-propagate adder ("CPA") circuitry for operating on the outputs of the third compressor circuitry to produce the further outputs.

9. The DSP circuit block defined in claim 8 wherein the CPA circuitry comprises:
carry-out circuitry for applying a carry out signal of the CPA circuitry to the first other DSP circuit block; and
carry-in circuitry for selectively receiving a carry out signal of the CPA circuitry in the second other DSP circuit block.

10. The DSP circuit block defined in claim 1 wherein each of the first and second multiplier circuits can multiply an N-bit multiplicand by an N-bit multiplier.

11. The DSP circuit block defined in claim 10 wherein N is equal to 18.

12. The DSP circuit block defined in claim 1 further comprising:
redundancy circuitry for allowing the first other DSP circuit block to be a selectable one of (1) another DSP circuit block that is immediately adjacent to the DSP circuit block, and (2) yet another DSP circuit block that is not immediately adjacent to the DSP circuit block.

13. The DSP circuit block defined in claim 12 wherein the yet another DSP circuit block is immediately adjacent to the another DSP circuit block.

14. The DSP circuit block defined in claim 12 further comprising:
further redundancy circuitry for allowing the second other DSP circuit block to be a selectable one of (1) still another DSP circuit block that is immediately adjacent to the DSP circuit block, and (2) still a further other DSP circuit block that is not immediately adjacent to the DSP circuit block.

15. The DSP circuit block defined in claim 14 wherein the still a further other DSP circuit block is immediately adjacent to the still another DSP circuit block.

16. The DSP circuit block defined in claim 1 wherein the first shifter circuitry is alternatively able to output data that is all zeros.

17. The DSP circuit block defined in claim 1 wherein the second shifter circuitry is alternatively able to output data that is all zeros.

18. The DSP circuit block defined in claim 1 wherein the circuitry for selectively routing is alternatively able to output data that is all zeros.

19. Digital signal processing ("DSP") circuitry in an integrated circuit device, said circuitry comprising:
a plurality of DSP circuit blocks, each of which is capable of performing DSP operations on signals applied to that DSP circuit block, each of the DSP circuit blocks including:
a plurality of components, each for performing a respective arithmetic operation as part of DSP operations; and
circuitry, separate from general-purpose interconnect of said integrated circuit device, for selectively routing outputs of a plurality of individual ones of the plurality of components directly to components of first and second other ones of the DSP circuit blocks, that are on respective opposite sides of that DSP circuit block, without using said general-purpose interconnect for said routing, wherein the circuitry for selectively routing of each of the DSP circuit blocks comprises:
redundancy circuitry, separate from said general-purpose interconnect, for allowing selection of the first other DSP circuit block for that DSP circuit block from among both (1) another DSP circuit block that is immediately adjacent to that DSP circuit block, and (2) yet another DSP circuit block that is not immediately adjacent to that DSP circuit block.

20. The DSP circuitry defined in claim 19 wherein the yet another DSP circuit block is immediately adjacent to the another DSP circuit block.

21. The DSP circuitry defined in claim 19 wherein the circuitry for selectively routing of each of the DSP circuit blocks further comprises:
further redundancy circuitry, separate from said general-purpose interconnect, for allowing selection of the second other DSP circuit block for that DSP circuit block from among both (1) still another DSP circuit block that is immediately adjacent to that DSP circuit block, and (2) still a further other DSP circuit block that is not immediately adjacent to that DSP circuit block.

22. The DSP circuitry defined in claim 21 wherein the still a further other DSP circuit block is immediately adjacent to the still another DSP circuit block.

23. The DSP circuitry defined in claim 19 wherein the circuitry for selectively routing of each of the DSP circuit blocks selectively routes the outputs to inputs of components of the first and second other ones of the DSP circuit blocks that are downstream from some but not all components of the first and second other ones of the DSP circuit blocks that are capable of performing arithmetic operations.

24. The DSP circuitry defined in claim 19 wherein each of the DSP circuit blocks is disposed in a respective one of a plurality of rows which also includes other circuitry, the other circuitry in each of the rows having a maximum width W between other adjacent rows, and the DSP circuit blocks in each of the rows also having a maximum width W between the other adjacent rows.

25. Digital signal processing ("DSP") circuitry in an integrated circuit device, said circuitry comprising:
a plurality of DSP circuit blocks including a plurality of components, each of which is capable of performing, one after another in succession, a plurality of arithmetic operations as part of DSP operations, each of the DSP circuit blocks including circuitry, separate from general-purpose interconnect of said integrated circuit device, for selectively routing outputs of a plurality of individual ones of the plurality of components of that DSP circuit block to first and second other ones of the DSP circuit blocks that are on respective opposite sides of that DSP circuit block, without using said general-purpose interconnect for said routing, wherein the circuitry for selectively routing of each DSP circuit block selectively routes at least some of the outputs directly to inputs of components in the first and second other DSP circuit blocks that are intermediate in the succession of components in those other DSP circuit blocks; and
redundancy circuitry, separate from general-purpose interconnect, for allowing selection of the first other DSP circuit block for each of the DSP circuit blocks from among both (1) another of the DSP circuit blocks that is immediately adjacent to the DSP circuit block, and (2) yet another of the DSP circuit blocks that is not immediately adjacent to the DSP circuit block.

26. The DSP circuitry defined in claim 25 wherein at least some of the inputs are inputs to components at a different point in the succession in the other DSP circuit blocks than the point in the succession of components in the DSP circuit block from which the circuitry for selectively routing received the outputs selectively routed to those at least some inputs.

27. The DSP circuitry defined in claim 26 wherein each of the DSP circuit blocks further comprises:
   second circuitry for selectively routing a second output of a component in that DSP circuit block to an input of a same component in the first other DSP circuit block.

28. The DSP circuitry defined in claim 27, wherein each of the DSP circuit blocks further comprises:
   third circuitry, separate from said general-purpose interconnect, for selectively routing outputs of a final arithmetic operation in that DSP circuit block to inputs to a component in the first other DSP circuit block that is at an intermediate point in the succession of components in that other DSP circuit block, without using said general-purpose interconnect for said routing.

29. The DSP circuitry defined in claim 25 wherein the yet another of the DSP circuit blocks is immediately adjacent to the another of the DSP circuit blocks.

30. The DSP circuitry defined in claim 25 further comprising:
   further redundancy circuitry, separate from said general-purpose interconnect, for allowing selection of the second other DSP circuit block of each of the DSP circuit blocks from among both (1) still another of the DSP circuit blocks that is immediately adjacent to the DSP circuit block, and (2) still a further another one of the DSP circuit blocks that is not immediately adjacent to the DSP circuit block.

31. The DSP circuitry defined in claim 30 wherein the still a further another one of the DSP circuit blocks is immediately adjacent to the still another of the DSP circuit blocks.

* * * * *